(12) United States Patent
Nakamura

(10) Patent No.: US 7,594,317 B2
(45) Date of Patent: Sep. 29, 2009

(54) METHOD OF MANUFACTURING WIRING SUBSTRATE AND METHOD OF MANUFACTURING ELECTRONIC COMPONENT MOUNTING STRUCTURE

(75) Inventor: Junichi Nakamura, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 307 days.

(21) Appl. No.: 11/595,915

(22) Filed: Nov. 13, 2006

(65) Prior Publication Data

US 2007/0124924 A1 Jun. 7, 2007

(30) Foreign Application Priority Data

Dec. 7, 2005 (JP) .............................. 2005-353562

(51) Int. Cl.
H05K 3/02 (2006.01)
H05K 3/04 (2006.01)
H05K 3/30 (2006.01)
H05K 3/32 (2006.01)

(52) U.S. Cl. .............................. 29/832; 29/825; 29/831; 29/840

(58) Field of Classification Search .................. 29/825, 29/830, 831, 832, 840
See application file for complete search history.

(56) References Cited

U.S. PATENT DOCUMENTS

| | | | | |
|---|---|---|---|---|
| 4,287,014 A | * | 9/1981 | Gaku et al. ............. | 156/306.9 |
| 4,614,559 A | * | 9/1986 | Shirasawa et al. ............ | 156/182 |
| 4,702,785 A | * | 10/1987 | Burger ......................... | 156/91 |
| 4,875,283 A | * | 10/1989 | Johnston ...................... | 29/830 |
| 5,495,665 A | * | 3/1996 | Carpenter et al. ............. | 29/830 |
| 5,505,321 A | * | 4/1996 | Caron et al. .................. | 216/20 |
| 2004/0154162 A1 | | 8/2004 | Lee et al. ...................... | 29/831 |
| 2004/0211751 A1 | | 10/2004 | Shuto et al. | |

(Continued)

FOREIGN PATENT DOCUMENTS

JP   2003-347459   12/2003

(Continued)

OTHER PUBLICATIONS

"Status and trends for PWBs with embedded components" by Rapala, EIPC Spring Conference, Prague 2003, p. 143-150.*

(Continued)

Primary Examiner—David P Bryant
Assistant Examiner—Dhanvir Aujla
(74) Attorney, Agent, or Firm—Kratz, Quintos & Hanson, LLP

(57) ABSTRACT

A method of manufacturing a wiring substrate including the steps of, obtaining a temporary substrate from a prepreg, and concurrently attaching a metal foil onto at least one surface of the temporary substrate, by disposing the metal foil on a prepreg through a underlying layer interposed between them, in a way that the underlying layer is disposed in a wiring formation region on the prepreg, and the metal foil having a size larger than that of the underlying layer is caused to contact with an outer peripheral portion of the wiring formation region, and then by hardening the prepreg with heating and pressurization, forming a build-up wiring layer on the metal foil, and obtaining a wiring member in which the build-up wiring layer is formed on the metal foil, by cutting out a portion of structure in which the underlying layer, the metal foil and the build-up wiring layer are formed on the temporary substrate, the portion corresponding to a peripheral portion of the underlying layer, and thus by separating the metal foil from the temporary substrate.

11 Claims, 9 Drawing Sheets

U.S. PATENT DOCUMENTS

| | | |
|---|---|---|
| 2005/0088833 A1 | 4/2005 | Kikuchi et al. ............... 361/763 |
| 2005/0155222 A1 | 7/2005 | Nakamura |

FOREIGN PATENT DOCUMENTS

| | | |
|---|---|---|
| JP | 2004-87701 | 3/2004 |
| JP | 2004-235323 | 8/2004 |
| JP | 2004-363536 | 12/2004 |
| JP | 2005-63987 | 3/2005 |
| JP | 2005-093979 | 4/2005 |
| JP | 2005-236244 | 9/2005 |

OTHER PUBLICATIONS

Japanese Office Action mailed Feb. 27, 2007 with partial English translation (3 pages).

* cited by examiner

METHOD OF MANUFACTURING WIRING SUBSTRATE AND METHOD OF MANUFACTURING ELECTRONIC COMPONENT MOUNTING STRUCTURE

CROSS-REFERENCE TO RELATED APPLICATIONS

This application is based on and claims priority of Japanese Patent Application No. 2005-353562 filed on Dec. 7, 2005, the entire contents of which are incorporated herein by reference.

BACKGROUND OF THE INVENTION

1. Field of the Invention

The present invention relates to a method of manufacturing a wiring substrate and a method of manufacturing an electronic component mounting structure. More specifically, the present invention relates to a method of manufacturing a wiring substrate applicable to a mounting substrate for an electronic component, and to a method of manufacturing an electronic component mounting structure for mounting an electronic component on the wiring substrate.

2. Description of the Related Art

As a wiring substrate for mounting an electronic component, there has heretofore been a method of obtaining a wiring substrate by forming a desired wiring layer on a temporary substrate in a detachable manner and then detaching the wiring layer from the temporary substrate. Patent Literature 1 (Japanese Unexamined Patent Publication No. 2005-236244) discloses a method of obtaining a wiring substrate, which includes the steps of: forming a copper foil on a resin substrate while attaching only a peripheral side thereof by using an adhesive layer; forming a build-up wiring layer thereon; and thereafter separating the copper foil and the build-up wiring layer from the resin substrate by cutting out an inside portion of the resin substrate, the portion being inward from the adhesive layer.

Meanwhile, Patent Literature 2 (Japanese Unexamined Patent Publication No. 2004-87701) discloses a method of obtaining a wiring substrate, which includes the steps of: attaching a releasing film and a metal base onto the carrier plate by using an adhesive layer, the releasing film being smaller than a carrier plate, and the metal base having the same size as the carrier plate; forming a metal pad on the metal base; and thereafter, separating the metal base from the releasing film and the carrier plate by cutting out a peripheral portion of the releasing film of the wiring substrate.

Moreover, Patent Literature 3 (Japanese Unexamined Patent Publication No. 2004-235323) discloses a method of obtaining a wiring substrate, which includes the steps of: laminating a first metal layer and a second metal layer on a core substrate in a way that a position of an outer periphery of the first layer is located more inward than a position of an outer periphery of the second metal layer, and attaching both layers by use of an adhesive film; forming a build-up wiring layer on the second metal layer; and thereafter, separating the second metal layer and the build-up wiring layer from the first metal layer and the core substrate by cutting out a peripheral portion of the first metal layer of the wiring substrate.

Furthermore, Patent Literature 4 (Japanese Unexamined Patent Publication No. 2005-63987) discloses a method of obtaining a wiring substrate, which includes the steps of: forming a first dielectric sheet and a second dielectric sheet, located in a way that the second dielectric sheet wraps the first dielectric sheet, on a substrate provided with a groundwork dielectric sheet on an upper side; forming a wiring layer thereon; and thereafter by cutting out an outer peripheral portion of the first dielectric sheet of the wiring substrate, and thus separating the first dielectric sheet from the substrate provided with the groundwork dielectric sheet.

However, the techniques according to the above-described Patent Literatures 1 to 3 require a step of attaching a metal thin film or the metal base onto a variety of temporary substrates by use of the adhesive layer in a detachable state. Accordingly, this step may be complicated, and may cause a cost increase.

SUMMARY OF THE INVENTION

An object of the present invention is to provide a method of manufacturing a wiring substrate which can be manufactured at low costs without causing any troubles, in a method of manufacturing a wiring substrate in which after a desired wiring layer is formed on a temporary substrate in a detachable state, a wiring substrate is obtained by separating the wiring layer from the temporary substrate. And an object of the present invention is to provide a method of manufacturing an electronic component mounting structure for mounting an electronic component easily on the wiring substrate.

A method of manufacturing a wiring substrate according to the present invention includes the steps of: obtaining a temporary substrate from a prepreg, and concurrently attaching a metal foil onto at least one surface of the temporary substrate, by disposing the metal foil on a prepreg through a underlying layer interposed between them, in a way that the underlying layer is disposed in a wiring formation region on the prepreg, and the metal foil having a size larger than that of the underlying layer is caused to contact with an outer peripheral portion of the wiring formation region, and then by hardening the prepreg with heating and pressurization; forming a build-up wiring layer on the metal foil; and obtaining a wiring member in which the build-up wiring layer is formed on the metal foil, by cutting out a portion of structure in which the underlying layer, the metal foil and the build-up wiring layer are formed on the temporary substrate, the portion corresponding to a peripheral portion of the underlying layer, and thus by separating the metal foil from the temporary substrate.

In the present invention, first, a semi-hardened prepreg is prepared, and the underlying layer (a metal foil, a releasing film or a releasing agent) is disposed in the wiring formation region on the prepreg. Then, the metal foil is disposed on the prepreg while interposing the underlying layer between them such that the metal foil of which size is a one size larger than the underlying layer is caused to contact with the outer peripheral portion of the wiring formation region of the prepreg.

Thereafter, the temporary substrate is obtained to harden the prepreg by heating and pressurizing the prepreg, the underlying layer and the metal foil. At the same time, the metal foil is partially attached onto the temporary substrate while interposing the underlying layer between them. Here, in a case where the underlying layer is the metal foil, the two metal foils simply contact with each other in the region where the metal foils overlap each other.

Subsequently, the desired build-up wiring layer is formed on the metal foil. Moreover, the structure in which the underlying layer, the metal foil, and the build-up wiring layer are formed on the temporary substrate, is cut out at the portion corresponding to the peripheral portion of the underlying layer. Thus, a region where the underlying layer and the metal foil overlap each other is obtained, and the underlying layer and the metal foil can be easily separated. In a case where the release agent is used as the underlying layer, the metal foil in which the release agent is formed is separated from the temporary substrate.

In this way, the wiring member in which the build-up wiring layer is formed on the metal foil is obtained. According to the present invention, it is possible to easily form the structure in which the underlying layer and the peripheral portion of the metal foil are attached onto the temporary substrate by hardening the prepreg having an adhesive function without providing an adhesive layer in particular. For this reason, it is possible to simplify the step of attaching the underlying layer and the metal foil to the temporary substrate, and to reduce manufacturing costs of the wiring substrate having no core substrate.

In one preferred mode of the present invention, the metal foil is removed after obtaining the wiring member, and the lowermost layer of the build-up wiring layer is exposed. Moreover, one of the uppermost layer and the lowermost layer of the build-up wiring layer constitutes an internal connection pad for mounting an electronic component, and the wiring layer on the opposite side constitutes an external connection pad.

Meanwhile, in a preferred mode in which an electronic component is mounted on the wiring substrate of the present invention, after obtaining the wiring member by separating the metal foil and the build-up layer thereon from the underlying layer, an electronic component is mounted on an upper surface of the wiring member while leaving the metal foil on a lower surface. Thereafter, the metal foil is removed from the wiring member to expose the lowermost wiring layer, which is used as the external connection pad. Since the metal foil functions as a reinforcing member, it becomes easy to convey or handle the wiring substrate without receiving an influence of warp rather than a case of mounting the electronic component after removing the metal foil. In this way, it is possible to mount the electronic component with high reliability.

Alternatively, the electronic component is mounted after the underlying layer, the metal foil and the build-up wiring layer are formed on the temporary substrate, and then the underlying layer is separated from the metal foil by cutting out the structure. In a case of this mode as well, the electronic component is mounted while the temporary substrate is present. Accordingly, it is possible to mount the electronic component with high reliability without receiving an influence of warp as similar to the above-described mode.

As described above, according to the present invention, it is possible to manufacture a wiring substrate having no core substrate without causing any troubles.

DESCRIPTION OF THE PREFERRED EMBODIMENTS

Hereinafter, embodiments of the present invention will be described below with reference to the accompanying drawings.

First Embodiment

FIGS. 1A to 1L are cross-sectional views sequentially showing a method of manufacturing a wiring substrate according to a first embodiment of the present invention.

Figure 1A:
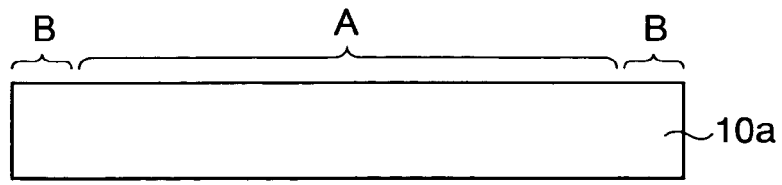
FIGS. 1A to 1L are cross-sectional views showing a method of manufacturing a wiring substrate according to a first embodiment of the present invention.

As shown in FIG. 1A, first, a prepreg 10a which is composed by impregnating a glass cloth (a woven fabric), a non-woven glass fabric, aramide fibers or the like with resin such as epoxy resin is prepared. The prepreg 10a of the B-stage (in a semi-hardened state) is used hereto.

Wiring formation regions A and outer peripheral portions B on the outside of the wiring formation regions A are defined on both surfaces of the prepreg 10a. The wiring formation regions A may be defined one by one on the respective surfaces of the prepreg 10a or a plurality of regions may be defined thereon.

Figure 1B:
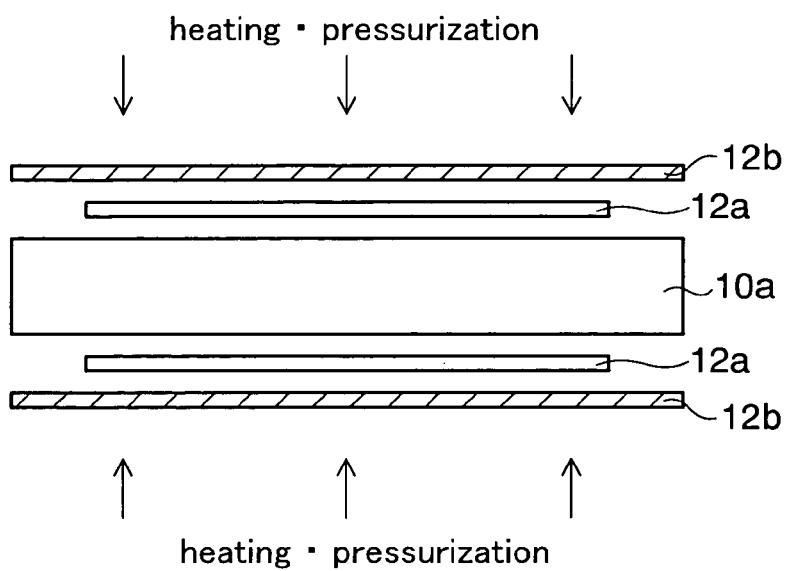

Thereafter, as shown in FIG. 1B, underlying layers 12a and copper foils 12b (metal foils) having a thickness in a range of 12 to 18 µm are prepared. As the underlying layer 12a, a metal foil such as a copper foil, a releasing film or a releasing agent is used. As the releasing film, laminated film formed by laminating a thin fluorocarbon resin (PTFE) layer on a polyester or polyethylene terephthalate (PET) film, or a polyester or PET film of which surface is subjected to silicone detachable processing is used. Meanwhile, as the release agent, a silicon-type release agent or a fluorine-type release agent is used.

Each of the underlying layer 12a is formed into the same size as that of the wiring formation region A on the prepreg 10a. Meanwhile, each of the copper foils 12b is formed with a size sufficient for covering the wiring formation region A and the outer peripheral region B on the prepreg 10a, and a size of the copper foils 12b is set to be a one size larger than that of the underlying layer 12a.

Figure 1C:
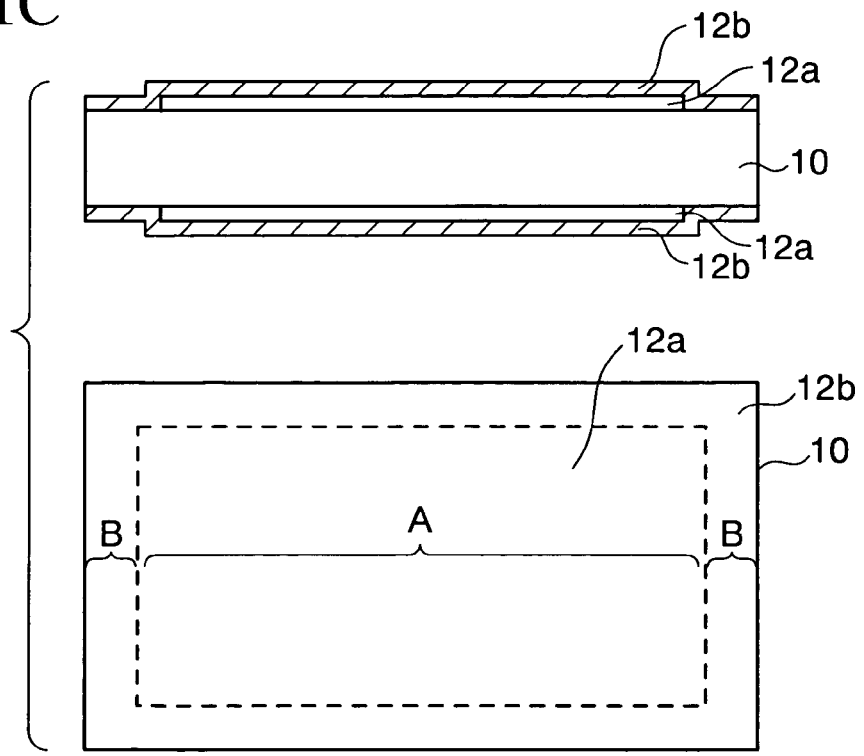

Then, underlying layers 12a and the copper foils 12b are disposed on the both surfaces side of the prepreg 10a from the bottom sequentially. The underlying layers 12a are disposed so as to respectively correspond to the wiring formation regions A on the prepreg 10a. The copper foils 12b are respectively superposed on the underlying layers 12a, and the peripheral portions thereof are disposed so as to contact with the outer peripheral portions B on the outer periphery of the wiring formation regions A on the prepreg 10a. Thereafter, the prepreg 10a, the underlying layers 12a, and the copper foils 12b are heated and pressurized from the both surfaces side at a temperature in a range of 190° C. to 200° C. in a vacuum atmosphere. In this way, as shown in FIG. 1C, the prepreg 10a is hardened, and a temporary substrate 10 made of glass epoxy resin or the like is obtained. Concurrently, the underlying layers 12a and the copper foils 12b are attached to the both surfaces of the temporary substrate 10 with hardening of the prepreg 10a. A whole of the underlying layers 12a is attached to the temporary substrate 10. Meanwhile, the peripheral portion of the copper foils 12b is partially attached to the outer peripheral portion B of the wiring formation region A on the temporary substrate 10. In a region where the underlying layer 12a and the copper foil 12b overlap each other, both of the constituents simply contact with each other. Accordingly, it is possible to easily separate the underlying layer 12a from the copper foil 12b in the above-mentioned region as will be described later.

In a case where the release agent is used as the underlying layer 12a, the release agent as described above is formed by coating or spraying on a region of a lower surface side of the copper foil 12b, where the underlying layer 12a is disposed. Then, the copper foil 12b is disposed on the prepreg 10a while interposing the release agent between them, and is attached to the prepreg 10a by heating and pressurizing. Thus, it is possible to separate the copper foil 12b from the temporary substrate 10 easily at the portion where the release agent (the underlying layer 12a) is provided.

As described above, in this embodiment, it is possible to obtain a structure in which the underlying layers 12a and the copper foils 12b are attached onto the temporary substrate 10 by disposing the underlying layers 12a and the copper foils 12b on the prepreg 10a, and by heating and pressurizing these constituents without using an adhesive in particular. Hence, it is possible to curtail a material cost for an adhesive, and to simplify the step of attaching the underlying layers 12a and the copper foils 12b to the temporary substrate 10, thereby manufacturing time can be shortened. In this way, it is possible to reduce manufacturing costs.

Figure 1D:
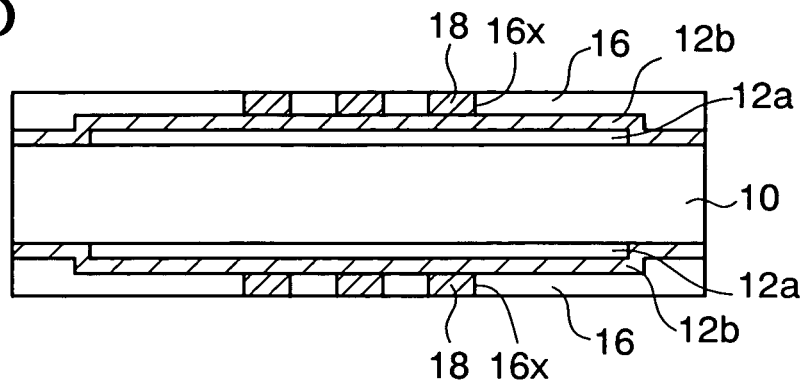
Figure 1E:
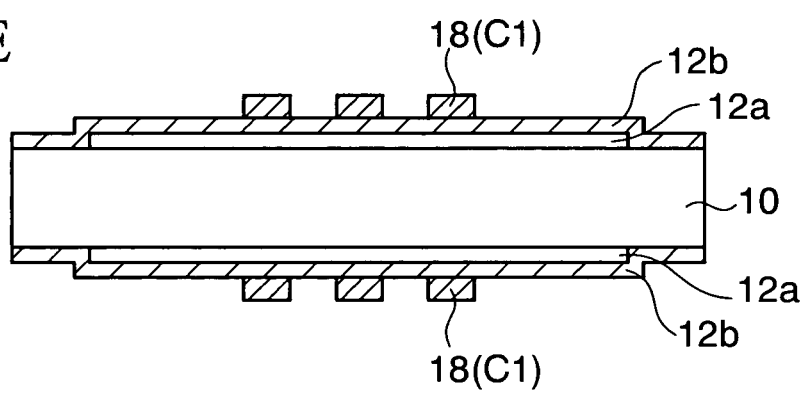

Subsequently, as shown in FIG. 1D, plating resist films 16 provided with openings 16x at desired portions are formed on the both surfaces side of the temporary substrate 10. Moreover, first wiring layers 18 made of gold (Au), nickel (Ni), tin (Sn) or the like are formed in the openings 16x of the plating resist films 16 by electrolytic plating while using the copper foils 12b as plating power-supply layers. Thereafter, as shown in FIG. 1E, the plating resist films 16 are removed. The first wiring layers 18 function as internal connection pads C1 as described later.

Figure 1F:
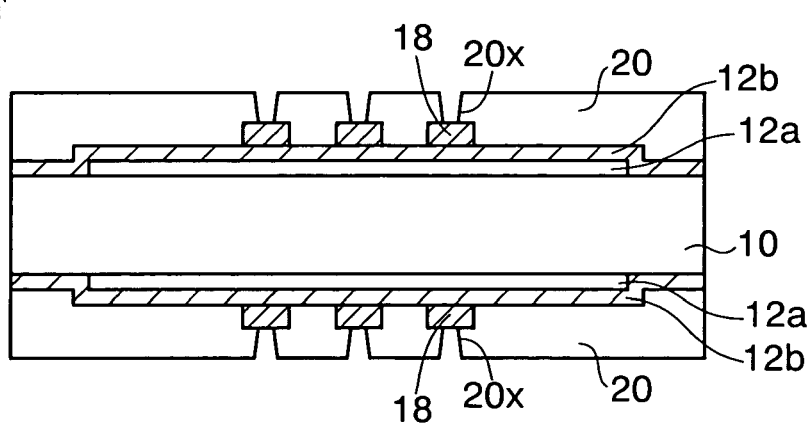

Subsequently, As shown in FIG. 1F, first insulating layers 20 for covering the first wiring layers 18 and the copper foils 12b are formed on the both surfaces side of the temporary substrate 10 respectively. As the material of the first insulating layers 20, an epoxy resin, a polyimide resin or the like is used. In an example of a method of forming the first insulating layers 20, the first insulating layers 20 are obtained by laminating resin films respectively on the both surfaces side of the temporary substrate 10, and thereafter, hardening the resin films by a heat treatment at a temperature in a range from 130° C. to 150° C. while pressing (pressurizing) the resin films.

Subsequently, as shown in FIG. 1F again, the first insulating layers 20 are processed with a laser or the like so as to expose the first wiring layers 18 on the both surfaces side of the temporary substrate 10, thereby forming first via holes 20x respectively.

Here, the first insulating layers 20 may be formed by patterning a photosensitive resin film by means of photolithography, or by patterning resin films provided with openings by means of screen printing.

Figure 1G:
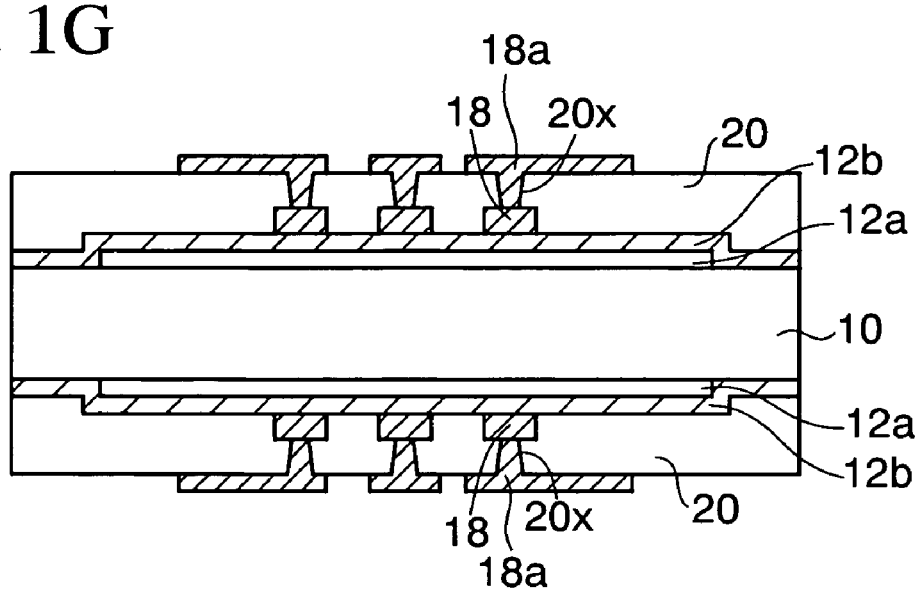

Subsequently, as shown in FIG. 1G, second wiring layers 18a made of copper (Cu) or the like, which are connected to the first wiring layers 18 through the first via holes 20x, are formed on the first insulating layers 20 respectively. The second wiring layers 18a are formed by a semi-additive method, for example. To be more precise, first, Cu seed layers (not shown) are formed inside the first via holes 20x and on the first insulating layers 20 by means of electroless plating, or by a sputtering method. Thereafter, resist films (not shown) having openings corresponding to the second wiring layers 18a are formed thereon. Subsequently, Cu layer patterns (not shown) are formed in the openings of the resist films by means of electrolytic plating while using the Cu seed layers as plating power-supply layer. Subsequently, the resist layers are removed and then the second wiring layers 18a are obtained by etching the Cu seed layers while using the Cu layer patterns as masks. In addition to the aforementioned semi-additive method, it is possible to employ various other wire forming methods such as a subtractive method as the method of forming the second wiring layers 18a.

Figure 1H:
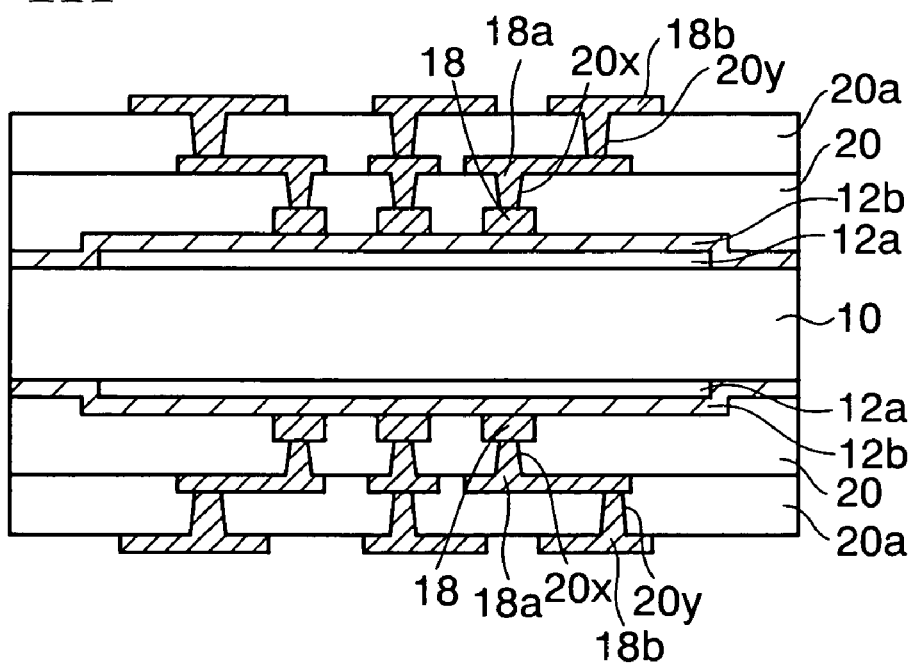

Then, as shown in FIG. 1H, second insulating layers 20a for covering the second wiring layers 18a are respectively formed on the both surfaces side of the temporary substrate 10 by repeating similar processes, and then second via holes 20y are respectively formed in portions on the second insulating layers 20a on the second wiring layers 18a. Furthermore, third wiring layers 18b to be connected to the second wiring layers 18a through the second via holes 20y are formed respectively on the second insulating layers 20a on the both surfaces side of the temporary substrate 10.

Figure 1I:
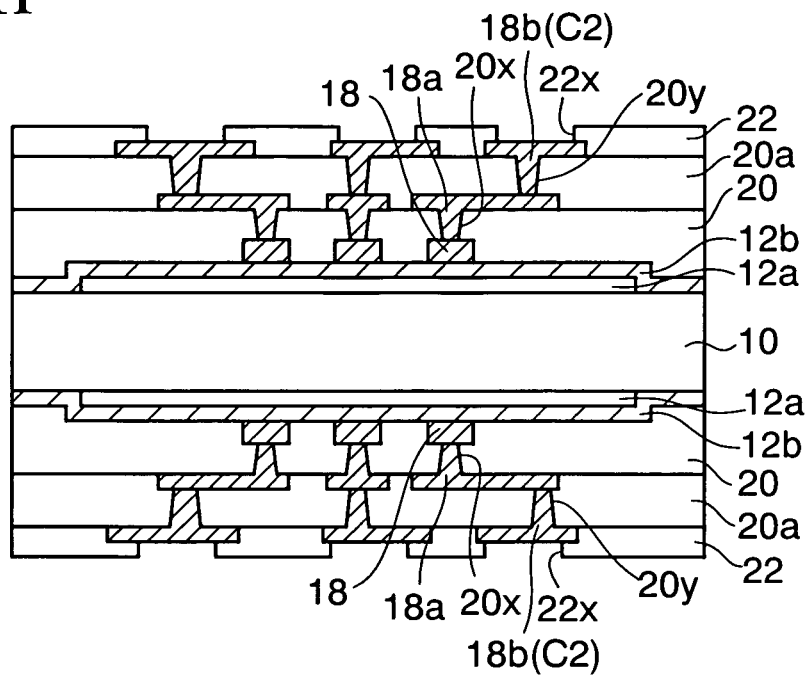

Subsequently, as shown in FIG. 1I, solder resist films 22 provided with openings 22x on the third wiring layers 18b are respectively formed on the both surfaces side of the temporary substrate 10. As a consequence, a portion of the third wiring layers 18b exposed inside the openings 22x of the solder resist films 22 constitute external connection pads C2. Here, it is possible to form contact layers such as Ni/Au plated layers on the third wiring layers 18b inside the openings 22x of the solder resist films 22 if it is necessary.

In this way, the desired build-up wiring layers are formed on the copper foils 12b above the temporary substrate 10. Although the three-layered build-up wiring layers (the first to third wiring layers 18 to 18b) are formed in the above-described example, it is possible to form n-layered (n is an integer equal to or greater than one) build-up wiring layers. Meanwhile, it is also possible to form a build-up wiring layer only on one surface of the temporary substrate 10.

As described previously, in this embodiment, the underlying layer 12a and the copper foil 12b simply contact with each other in the region where these constituents overlap each other. Accordingly, when forming the build-up wiring layer on the copper foil 12b, wrinkles may be generated in the build-up wiring layer in a case where a thermal expansion coefficient of the temporary substrate 10 is largely different from that of the build-up wiring layer, because the degrees of thermal expansion vary between the both constituents. From such a viewpoint, it is preferable that a substrate that a nonwoven glass fabric is impregnated with resin is used as the temporary substrate 10, such as a nonwoven glass fabric epoxy resin substrate and the like. The thermal expansion coefficient of the nonwoven glass fabric epoxy resin substrate ranges from 30 to 50 ppm/° C., therefore it is possible to approximate the thermal expansion coefficient thereof to an average thermal expansion coefficient (20 to 50 ppm/° C.) of the build-up wiring layer. Note that, a similar characteristic is obtained, in the case that a nonwoven fabric formed of aramid or liquid crystal polymer besides the nonwoven glass fabric is used. The thermal expansion coefficient of the wiring layers (Cu) of the build-up wiring layer is around 18 ppm/° C., and the thermal expansion coefficient of the insulating layers (the resin) is in a range of 50 to 60 ppm/° C.

Thus, even when heat is applied in the manufacturing process, the temporary substrate 10 and the build-up wiring layer expand substantially in the same degree. Accordingly, generation of wrinkles in the build-up wiring layer is prevented. In this way, it is possible to improve production yields and reliability of the build-up wiring layer.

Figure 1J:
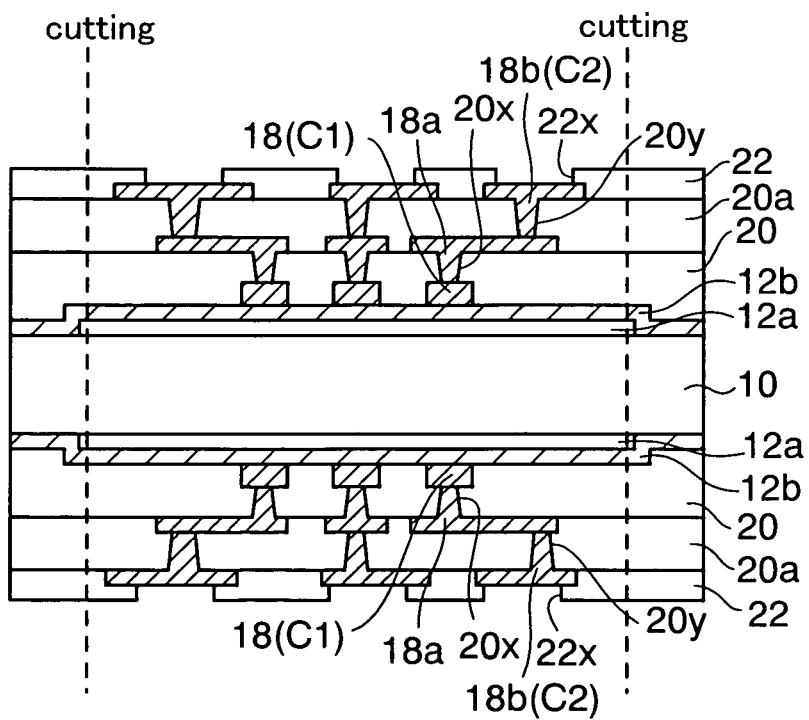
Figure 1K:
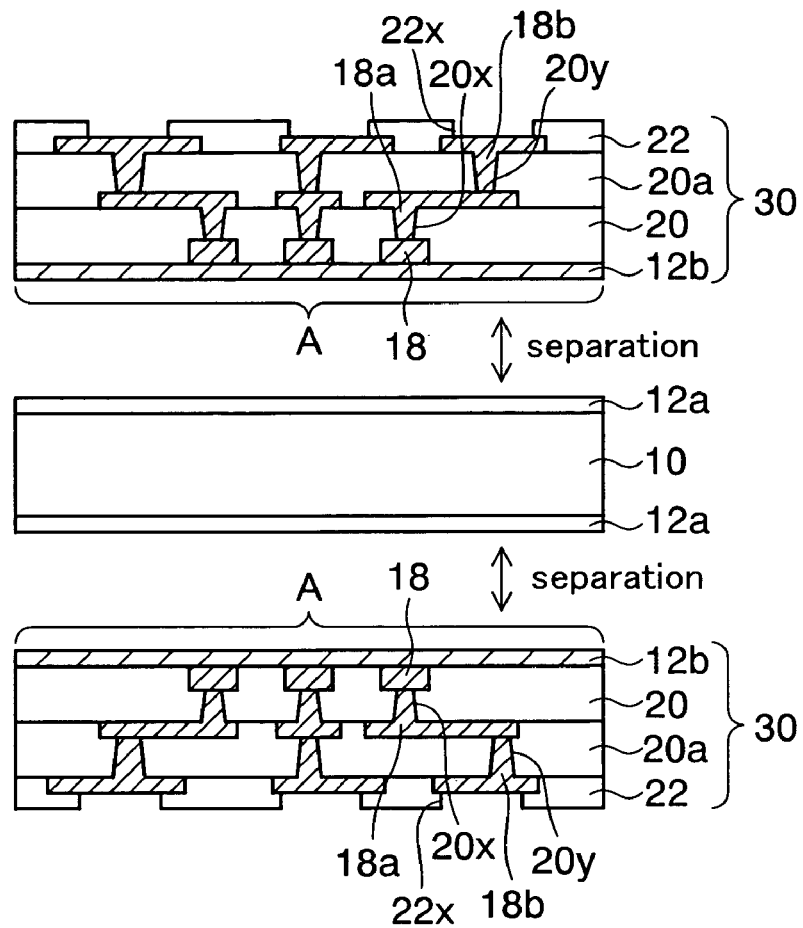

Subsequently, as shown in FIG. 1J, the outer peripheral portions B including the peripheral portions of the copper foils 12b are removed by cutting out portions corresponding to the periphery of the underlying layers 12a of the structure shown in FIG. 1I. Hence, as shown in FIG. 1K, the wiring formation regions A in which the underlying layer 12a and the copper foil 12b simply contact with each other are obtained. Thereby, the copper foils 12b can be easily separated from the underlying layers 12a. In this way, wiring members 30 composed of the copper foil 12b and the build-up wiring layer formed thereon are obtained from the both surfaces side of the temporary substrate 10.

Figure 1L:
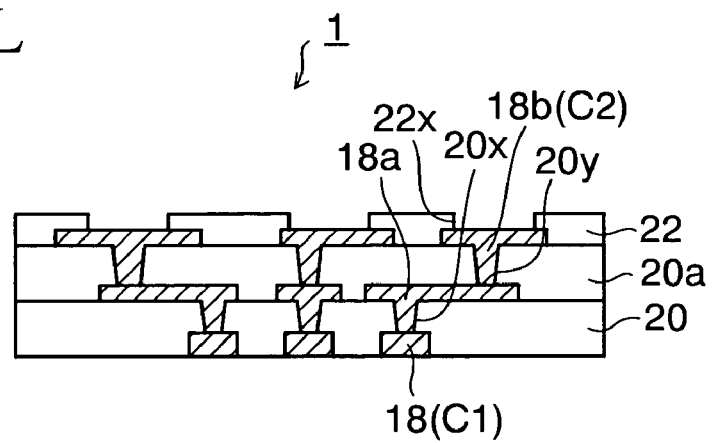

Thereafter, as shown in FIG. 1L, the copper foil 12b of the wiring member 30 is selectively removed from the first wiring layer 18 and the first insulating layer 20. For example, the copper foil 12b can be removed by selective etching on the first wiring layer 18 (such as Au) and the first insulating layer 20 by means of wet etching with a ferric chloride aqueous solution, a cupric chloride aqueous solution or an ammonium persulfate aqueous solution, for example.

Hence, as shown in FIG. 1L, a lower surface of the first wiring layer 18 is exposed, and internal connection pads C1 are obtained. By the manner described above, a wiring substrate 1 of the first embodiment is manufactured.

In a preferred example of this embodiment, a plurality of wiring formation regions A are defined on the both surfaces side of the temporary substrate 10, and in a state that underlying layer 12a is disposed on the block region composed of a plurality of wiring formation regions A, peripheral sides of the copper foil 12b is selectively attached to an outermost peripheral portion of a block region. Then, the build-up wiring layers are formed respectively in the wiring formation regions A. Thereafter, the copper foil 12b is removed from the wiring members 30 obtained by cutting out the peripheral portions of the underlying layer 12a of the resultant structure. Then, the wiring members 30 are divided into the respective wiring substrates.

It is also possible to form electrodes to be connected to the first wiring layer 18 by patterning instead of removing the copper foil 12b.

Meanwhile, in preferred example of this embodiment, a semiconductor chip is electrically connected to the internal connection pads C1 (the first wiring layer 18) and mounted on it, and external connection terminals are provided on the external connection pads C2 (the third wiring layer 18b).

As described above, according to the method of manufacturing a wiring substrate of this embodiment, the underlying layers 12a and the copper foils 12b larger than the underlying layers 12a are superposed and disposed on the both surfaces of the prepreg 10a, and the temporary substrate 10 is obtained by hardening the prepreg 10a with heating and pressurization. At this time, the underlying layers 12a and the copper foils 12b can be concurrently attached to the both surfaces of the temporary substrate 10 without using adhesive layers. Subsequently, the build-up wiring layers are formed on the copper foils 12b. Moreover, the underlying layers 12a are separated from the copper foils 12b by cutting out the portions of the structure corresponding to the peripheral portions of the underlying layers 12a. Accordingly, the wiring members 30 each composed of the copper foil 12b and the build-up wiring layer formed thereon are obtained from the both surfaces side of the temporary substrate 10.

In this embodiment, since the prepreg 10a having the adhesive function is used as the material of the temporary substrate 10, it is possible to attach the underlying layers 12a and the copper foils 12b onto the temporary substrate 10 without using adhesive layers. Thus, it is possible to simplify the step of attaching the underlying layers 12a and the copper foils 12b, and to reduce the manufacturing costs.

Second Embodiment

FIGS. 2A to 2F are cross-sectional views showing a method of manufacturing an electronic component mounting structure according to a second embodiment of the present invention. In the second embodiment, a preferred method of mounting an electronic component on a wiring substrate will be described on the basis of the technical idea of the method of manufacturing a wiring substrate of the present invention.

Figure 2A:
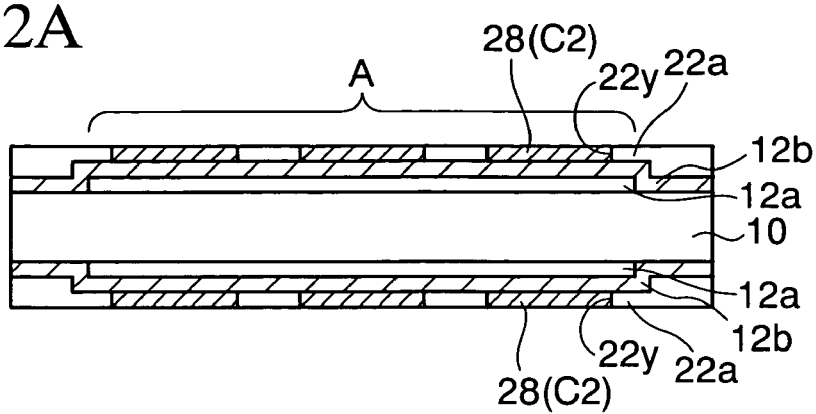
FIGS. 2A to 2F are cross-sectional views showing a method of manufacturing an electronic component mounting structure according to a second embodiment of the present invention.

As shown in FIG. 2A, first, a structure in which underlying layers 12a and copper foils 12b larger than the underlying layers 12a are attached to both surfaces side of a temporary substrate 10 is obtained by the method similar to that of the first embodiment. Moreover, after solder resist films 22a which are provided with openings 22y on the copper foils 12b are formed on the copper foil 12b on the both surfaces side of the temporary substrate 10, first wiring layers 28 are formed on the openings 22y by electrolytic plating. In the second embodiment, the internal connection pads C1 and the external connection pads C2 of the first embodiment are disposed with reversing up and down, and the first wiring layers 28 function as the external connection pads C2.

Figure 2B:
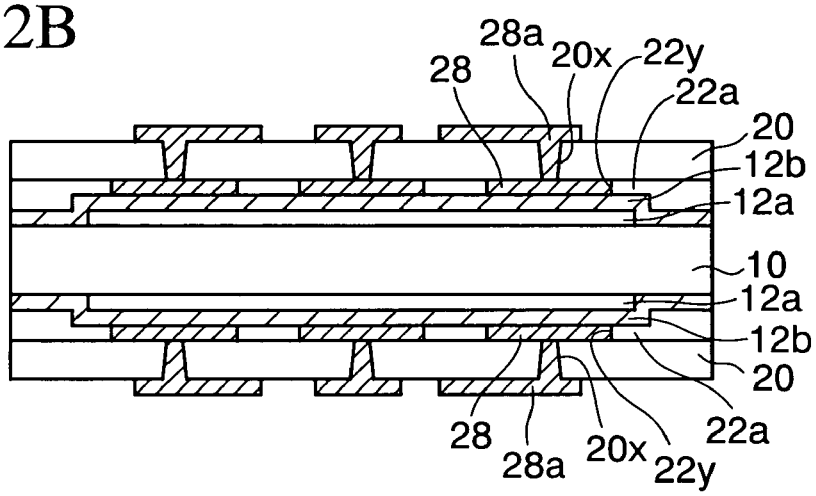

Next, as shown in FIG. 2B, first insulating layers 20 for covering the first wiring layers 28 are formed on the both surfaces side of the temporary substrate 10. Then, second wiring layers 28a to be connected to the first wiring layers 28 through first via holes 20x provided on the first insulating layers 20 are respectively formed on the first insulating layers 20 by the method similar to that of the first embodiment.

Figure 2C:
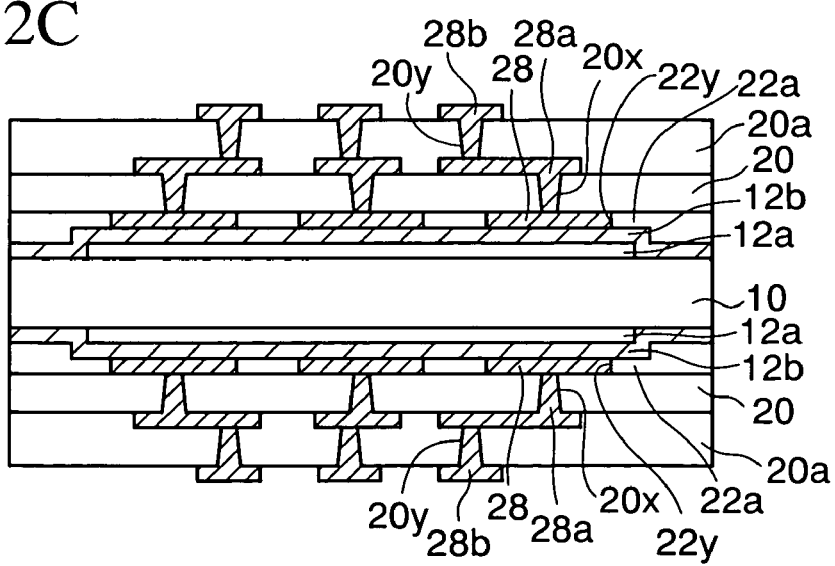

Subsequently, as shown in FIG. 2C, after second insulating layers 20a for covering the second wiring layers 28a are formed on the both surfaces side of the temporary substrate 10, second via holes 20y are formed respectively on portions of the second insulating layers 20a on the second wiring layers 28a. Moreover, third wiring layers 28b to be connected to the second wiring layers 28a through the second via holes 20y are respectively formed on the second insulating layers 20a on the both surfaces side of the temporary substrate 10.

Figure 2D:
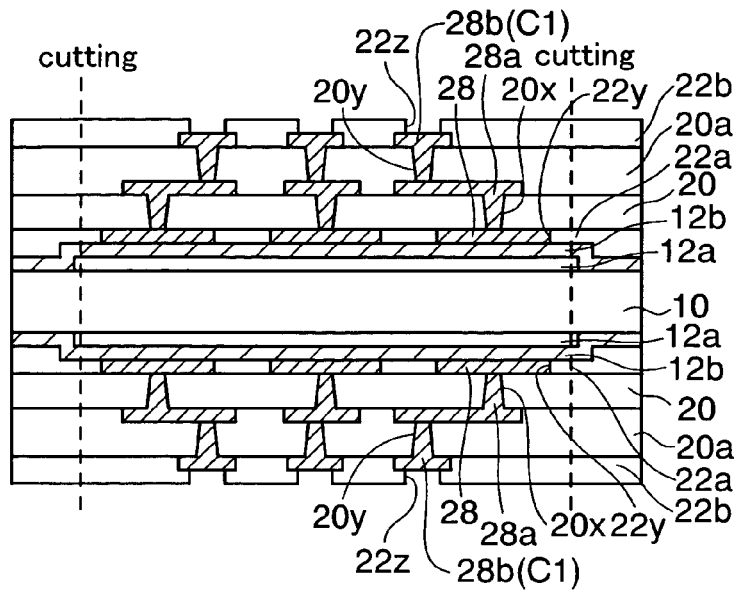

Next, as shown in FIG. 2D, solder resist films 22b provided with openings 22z are formed on the third wiring layers 28b. Then, in the second embodiment, exposed portions of the third wiring layers 28b constitute internal connection pads C1.

Figure 2E:
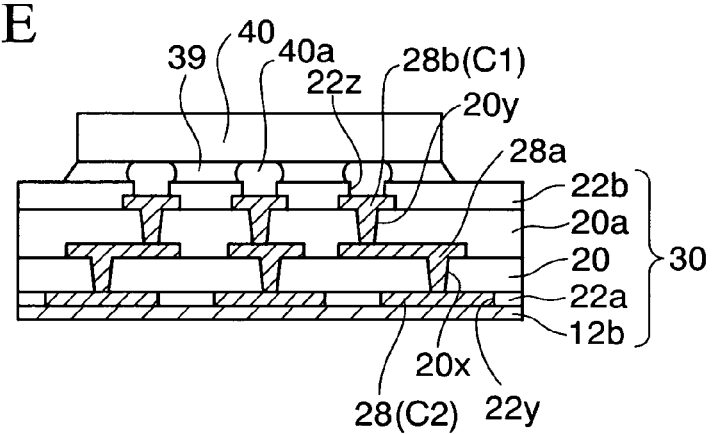

Next, as shown in FIG. 2D again, a portion of the structure of FIG. 2D, the portion corresponding to the peripheral portions of the underlying layer 12a are cut out as similar to the first embodiment. In this way, as shown in FIG. 2E, wiring members 30 having the structure in which build-up wiring layers are formed on the copper foils 12 are obtained. Furthermore, a semiconductor chip 40 (an electronic component) having bumps 40a is prepared and the bumps 40a of the semiconductor chip 40 are connected to the internal connection pads C1 on an upper side of the wiring member 30 by flip-chip bonding. Moreover, underfill resin 39 is filled into an interstice on a lower side of the semiconductor chip 40.

Here, the semiconductor chip 40 is used as an example of the electronic component. However, it is also possible, to mount various electronic components such as a capacitor component. Moreover, in addition to flip-chip bonding, various mounting methods such as a wire bonding method may be employed as the method of mounting the electronic component.

In this embodiment, the copper foil 12b which functions as a reinforcing member remains in the wiring member 30, when the semiconductor chip 40 is mounted. Accordingly, it is easier to convey or handle the wiring member 30 while avoiding occurrence of warp. In this way, it is possible to mount the semiconductor chip 40 with high reliability.

Figure 2F:
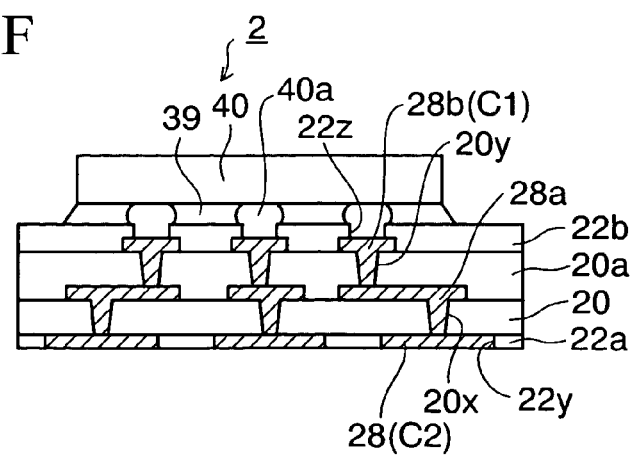

Thereafter, as shown in FIG. 2F, the external connection pads C2 (the first wiring layers 28) are exposed on the lower side by removing the copper foil 12b from the wiring member 30. Here, in a case where the conveyance or handling does not become problem, it is also possible to mount the semiconductor chip 40 after removing the copper foil 12b.

By the manner described above, an electronic component mounting structure 2 (a semiconductor device) of the second embodiment is obtained.

Figure 3A:
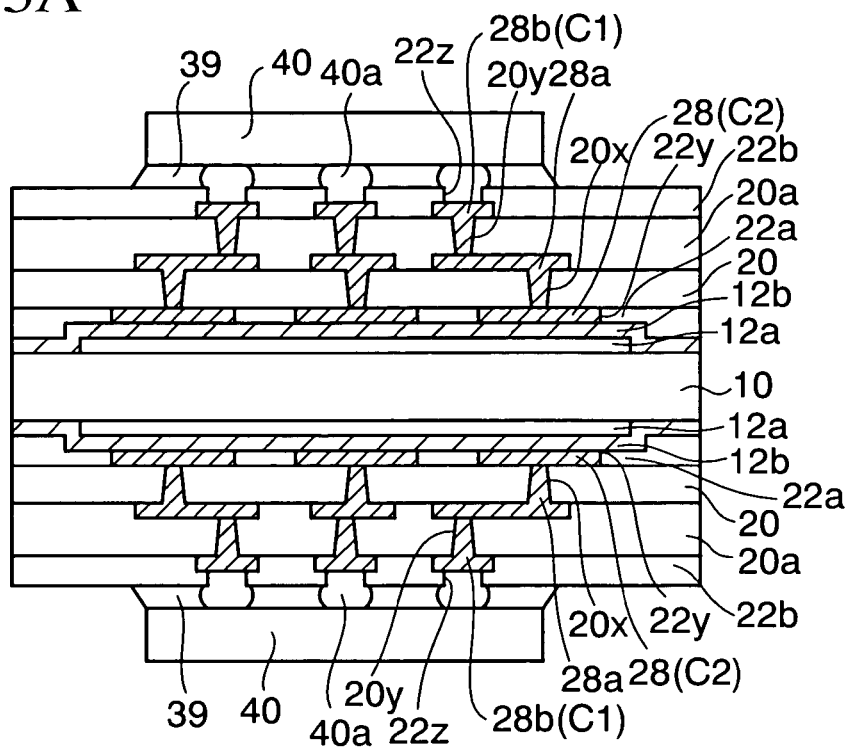
FIGS. 3A to 3D are cross-sectional views showing a method of manufacturing an electronic component mounting structure according to a variation of the second embodiment of the present invention.

FIGS. 3A to 3D show a method of manufacturing an electronic component mounting structure according to a variation of the second embodiment. As shown in FIG. 3A, before cutting out the structure as described in FIG. 2D, the bumps 40a of the semiconductor chips 40 may be connected to the internal connection pads C1 (the third wiring layers 28b) on the both surfaces by flip-chip bonding.

Figure 3B:
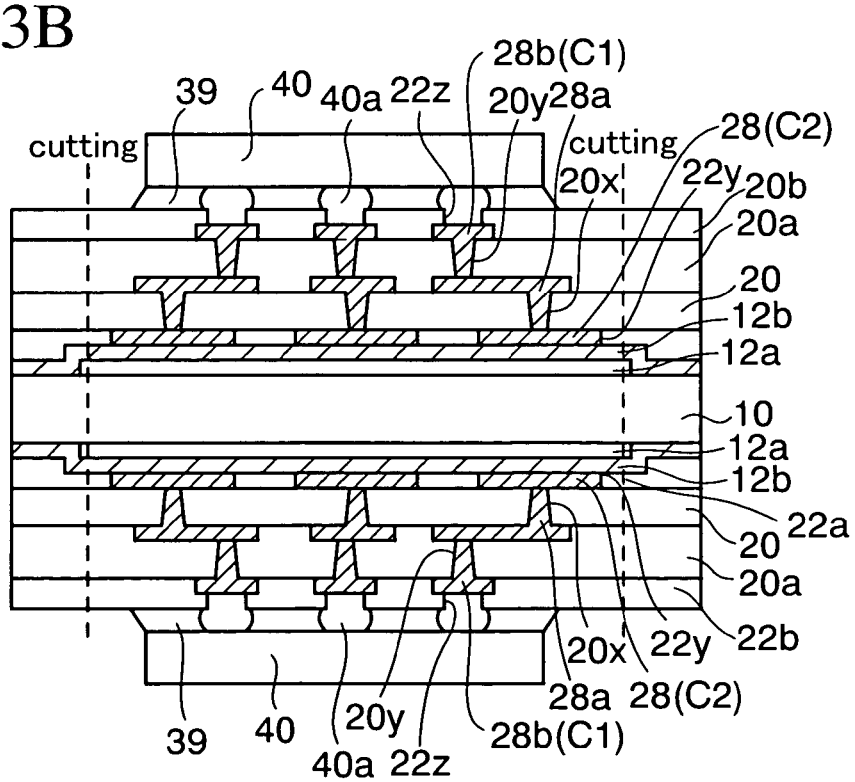
Figure 3C:
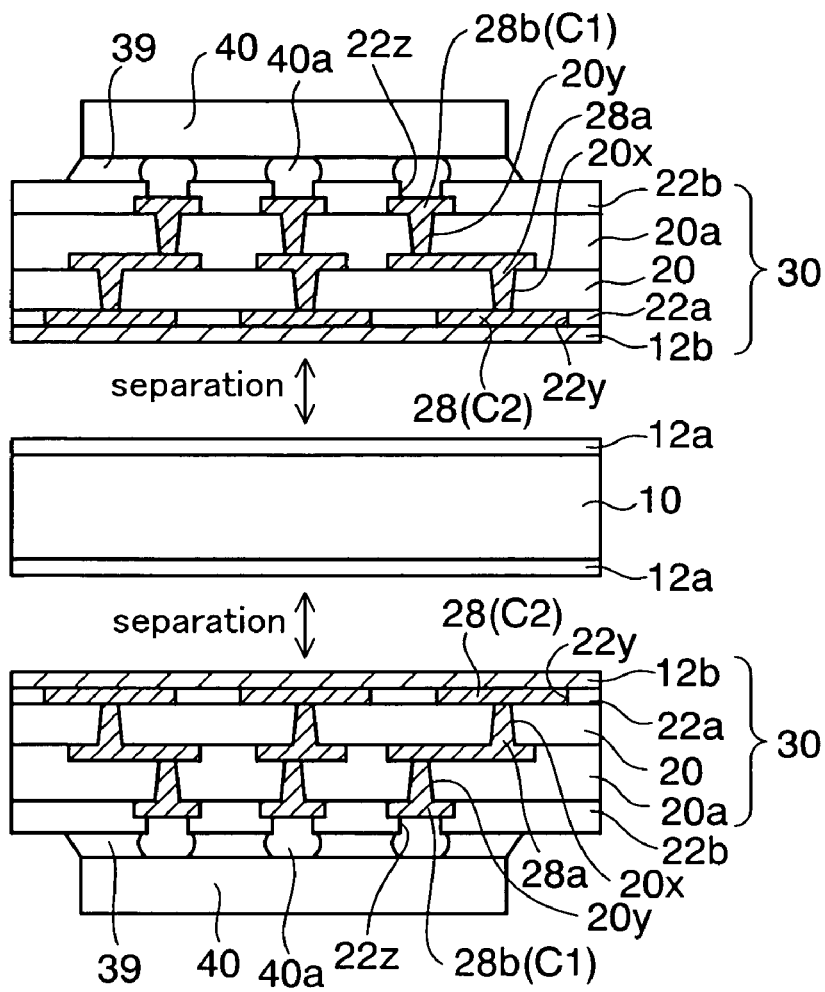
Figure 3D:
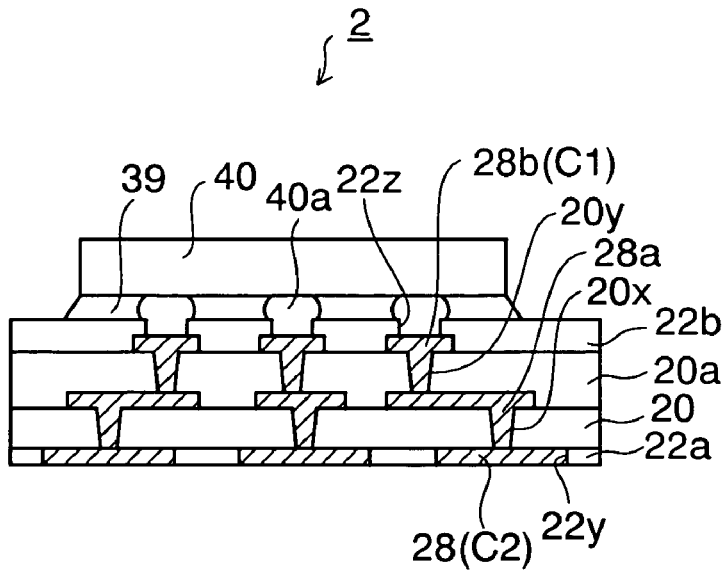

Thereafter, as shown in FIG. 3B, the portions corresponding to the peripheral portions of the underlying layers 12a of the structure of FIG. 3A are cut out. In this way, as shown in FIG. 3C, the copper foils 12b are separated from the underlying layers 12a, and the structures in each of which the semiconductor chip 40 is mounted on the wiring member 30 composed of the copper foil 12b and the build-up wiring layer formed thereon are obtained from the both surfaces side of the temporary substrate 10. Furthermore, as shown in FIG. 3D, the external pads C2 (the first wiring layer 28) are exposed by removing the copper foil 12b from the wiring member 30. In this way, the electronic mounting structure 2 having the identical structure with FIG. 2F is obtained.

In this variation also, since the semiconductor chip 40 is mounted on the wiring member 30 provided on the temporary substrate 10, it is possible to mount the semiconductor chip 40 with high reliability without receiving an influence of warp and the like.

FIG. 2F and FIG. 3D show examples of adopting a land grid array (LGA) type as an external connection type, and the external connection pads C2 are used as lands. In a case where a ball grid array (BGA) type is adapted, solder balls or the like are placed on the external connection pads C2 and external connection terminals are provided thereon. Meanwhile, in a case where a pin grid array (PGA) type is adapted, lead pins are provided on the external connection pads C2.

What is claimed is:

1. A method of manufacturing a wiring substrate comprising the steps of:
   (a) obtaining a temporary substrate, without using any adhesive layer, by
   providing an adhesive prepreg to constitute the temporary substrate, the prepreg being in a semi-hardened state and having an adhesive function,
   placing a metal foil onto at least one surface of the prepreg with an underlying layer therebetween the underlying layer being placed within a wiring formation region of the prepreg,
   the metal foil having a size larger than that of the underlying layer and directly contacting an outer peripheral portion of the wiring formation region of the prepreg, and
   hardening the prepreg having the adhesive function with beating and pressurization, thereby obtaining the temporary substrate from the prepreg without using any adhesive layer, and concurrently attaching the metal foil onto the temporary substrate;
   (b) forming a build-up wiring layer on the metal foil;
   (c) obtaining a wiring member in which the build-up wiring layer is formed on the metal foil, by cutting out a portion of structure in which the underlying layer, the metal foil and the build-up wiring layer are formed on the temporary substrate, the portion corresponding to the outer peripheral portion of the underlying layer, and
   (d) separating the metal foil from the temporary substrate.

2. The method of manufacturing a wiring substrate according to claim 1, further comprising the step of removing the metal foil after the step of obtaining the wiring member.

3. The method of manufacturing a wiring substrate according to claim 1, wherein the prepreg is made of a nonwoven fabric impregnated with resin, and a thermal expansion coefficient of the temporary substrate is in a range of 30 to 50 ppm/° C.

4. The method of manufacturing a wiring substrate according to claim 2, wherein a lowermost wiring layer of the build-up wiring layer exposed in the step of removing the metal foil constitutes an internal connection pad for mounting an electronic component thereon, and an uppermost wiring layer of the build-up wiring layer constitutes an external connection pad.

5. The method of manufacturing a wiring substrate according to claim 2, wherein a lowermost wiring layer of the build-up wiring layer exposed in the step of removing the metal foil constitutes an external connection pad, and an uppermost wiring layer of the build-up wiring layer constitutes an internal connection pad for mounting an electronic component thereon.

6. The method of manufacturing a wiring substrate according to claim 1, wherein the underlying layer, the metal foil and the build-up wiring layers are formed on each of both surfaces side of the temporary substrate, and the wiring member is obtained from each of the both surfaces side of the temporary substrate.

7. The method of manufacturing a wiring substrate according to claim 1, wherein the underlying layer is made of any one of a metal foil, a releasing film and a releasing agent.

8. A method of manufacturing an electronic component mounting structure comprising the steps of:
   (a) obtaining a temporary substrate, without using any adhesive layer, by
   providing an adhesive prepreg to constitute the temporary substrate, the prepreg being in a semi-hardened state and having an adhesive function,
   placing a metal foil onto at least one surface of the prepreg with an underlying layer therebetween, the underlying layer being placed within a wiring formation region of the prepreg,
   the metal foil having a size larger than that of the underlying layer and directly contacting an outer peripheral portion of the wiring formation region of the prepreg, and
   hardening the prepreg having the adhesive function with heating and pressurization, thereby obtaining the temporary substrate from the prepreg without using any adhesive layer, and concurrently attaching the metal foil onto the temporary sustrate;
   (b) forming a build-up wiring layer on the metal foil;
   (c) obtaining a wiring member in which the build-up wiring layer is formed on the metal foil, by cutting out a portion of structure in which the underlying layer, the metal foil and the build-up wiring layer are formed on the temporary substrate, the portion corresponding to the outer peripheral portion of the underlying layer,
   (d) separating the metal foil from the temporary substrate;

(e) electrically connecting and mounting an electronic component onto an uppermost wiring layer of the wiring member; and (f) removing the metal foil from the wiring member.

9. A method of manufacturing an electronic component mounting structure comprising the steps of:

(a) obtaining a temporary substrate, without using any adhesive layer, by providing an adhesive prepreg to constitute the temporary substrate, the prepreg being in a semi-hardening state, and having an adhesive function, placing a metal foil onto at least one surface of the prepreg with an underlying layer therebetween, the underlying layer being placed within a wiring formation region of the prepreg, the metal foil having a size larger than that of the underlying layer and directly contacting an outer peripheral portion of the wiring formation region of the prepreg, and hardening the prepreg, having the adhesive function with heating and pressurization, thereby obtaining the temporary substrate from the prepreg without using any adhesive layer, and concurrently attaching the metal foil onto the temporary substrate;

(b) forming a build-up wiring layer on the metal foil;

(c) electrically connecting and mounting an electronic component onto an uppermost wiring layer of the build-up wiring layer;

(d) obtaining a wiring member in which the electronic component is mounted on the build-up wiring layer formed on the metal foil, by cutting out a portion of a structure in which the underlying layer, the metal foil, and the build-up wiring layer are formed on the temporary substrate, the portion corresponding to the outer peripheral portion of the underlying layer;

(e) separating the metal foil from the temporary substrate; and (f) removing the metal foil from the wiring member.

10. The method of manufacturing an electronic component mounting structure according to claim 8, wherein the underlying layer, the metal foil and the build-up wiring layers are formed on each of both surfaces side of the temporary substrate, and the wiring member is obtained from each of the both surfaces side of the temporary substrate.

11. The method of manufacturing an electronic component mounting structure according to claim 9, wherein the underlying layer, the metal foil and the build-up wiring layers are formed on each of both surfaces side of the temporary substrate, and the wiring member is obtained from each of the both surfaces side of the temporary substrate.

* * * * *